United States Patent
Brown et al.

(10) Patent No.: US 7,420,427 B2
(45) Date of Patent: Sep. 2, 2008

(54) PHASE-LOCKED LOOP WITH A DIGITAL CALIBRATION LOOP AND AN ANALOG CALIBRATION LOOP

(75) Inventors: James Easton Cameron Brown, San Jose, CA (US); Hans Thomas Cramer, San Bruno, CA (US)

(73) Assignee: Texas Instruments Incorporated, Dallas, TX (US)

( * ) Notice: Subject to any disclaimer, the term of this patent is extended or adjusted under 35 U.S.C. 154(b) by 79 days.

(21) Appl. No.: 11/390,755

(22) Filed: Mar. 28, 2006

(65) Prior Publication Data

US 2006/0214737 A1   Sep. 28, 2006

Related U.S. Application Data

(60) Provisional application No. 60/665,679, filed on Mar. 28, 2005.

(51) Int. Cl.
*H03L 7/08* (2006.01)

(52) U.S. Cl. .............................. 331/16; 331/10; 331/14; 331/44

(58) Field of Classification Search .................. 331/10, 331/16, 14, 44
See application file for complete search history.

(56) References Cited

U.S. PATENT DOCUMENTS

| | | | |
|---|---|---|---|
| 5,955,928 A * | 9/1999 | Smith et al. | 331/2 |
| 6,356,158 B1 * | 3/2002 | Lesea | 331/11 |
| 6,545,547 B2 * | 4/2003 | Fridi et al. | 331/16 |
| 6,903,615 B2 * | 6/2005 | Landman et al. | 331/57 |
| 6,952,124 B2 * | 10/2005 | Pham | 327/156 |
| 7,042,253 B2 * | 5/2006 | Su et al. | 327/17 |
| 7,103,337 B2 * | 9/2006 | Uozumi et al. | 455/255 |
| 7,221,921 B2 * | 5/2007 | Maligeorgos et al. | 455/260 |

* cited by examiner

*Primary Examiner*—Robert J. Pascal
*Assistant Examiner*—Levi Gannon
(74) *Attorney, Agent, or Firm*—Steven A. Shaw; W. James Brady; Frederick J. Telecky, Jr.

(57) ABSTRACT

A phase-locked loop (PLL) architecture (100) is provided that includes a voltage-controlled oscillator (VCO) (116). The PLL architecture (100) also includes a digital calibration loop (132) coupled to the VCO (116). The digital calibration loop (132) implements a digital filter (126) to provide a digital control to the VCO (116) for centering a VCO frequency output. The PLL architecture (100) also includes an analog calibration loop (130) coupled to the VCO (116). The analog calibration loop (130) provides an analog control to the VCO (116) for adjusting the centered VCO frequency output.

13 Claims, 4 Drawing Sheets

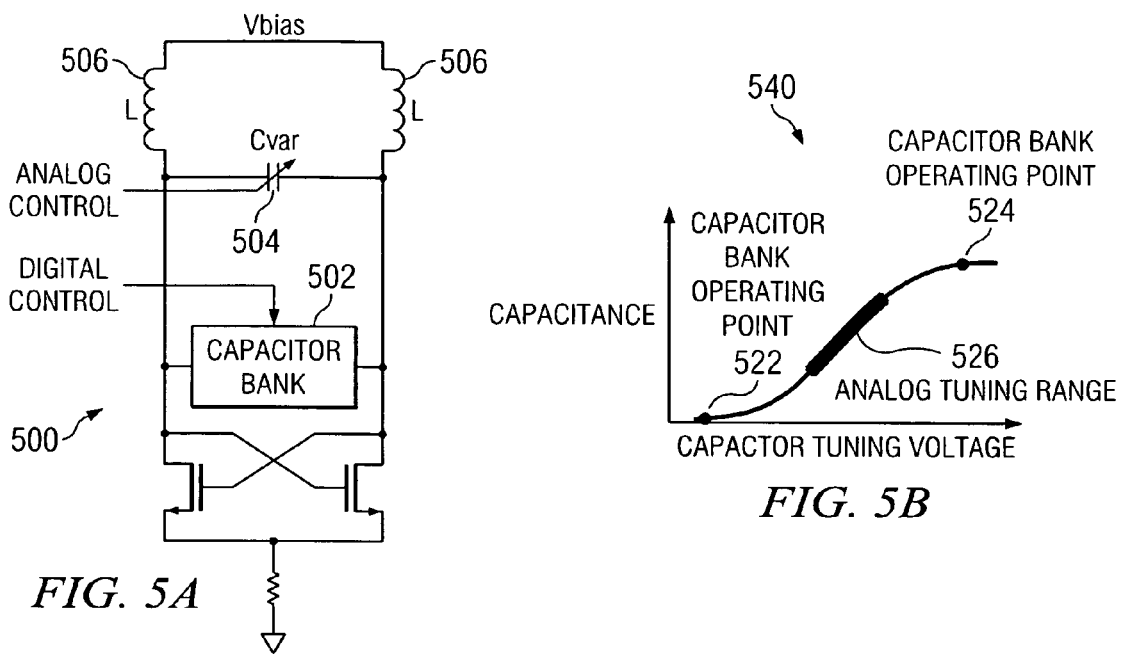
FIG. 5A
FIG. 5B
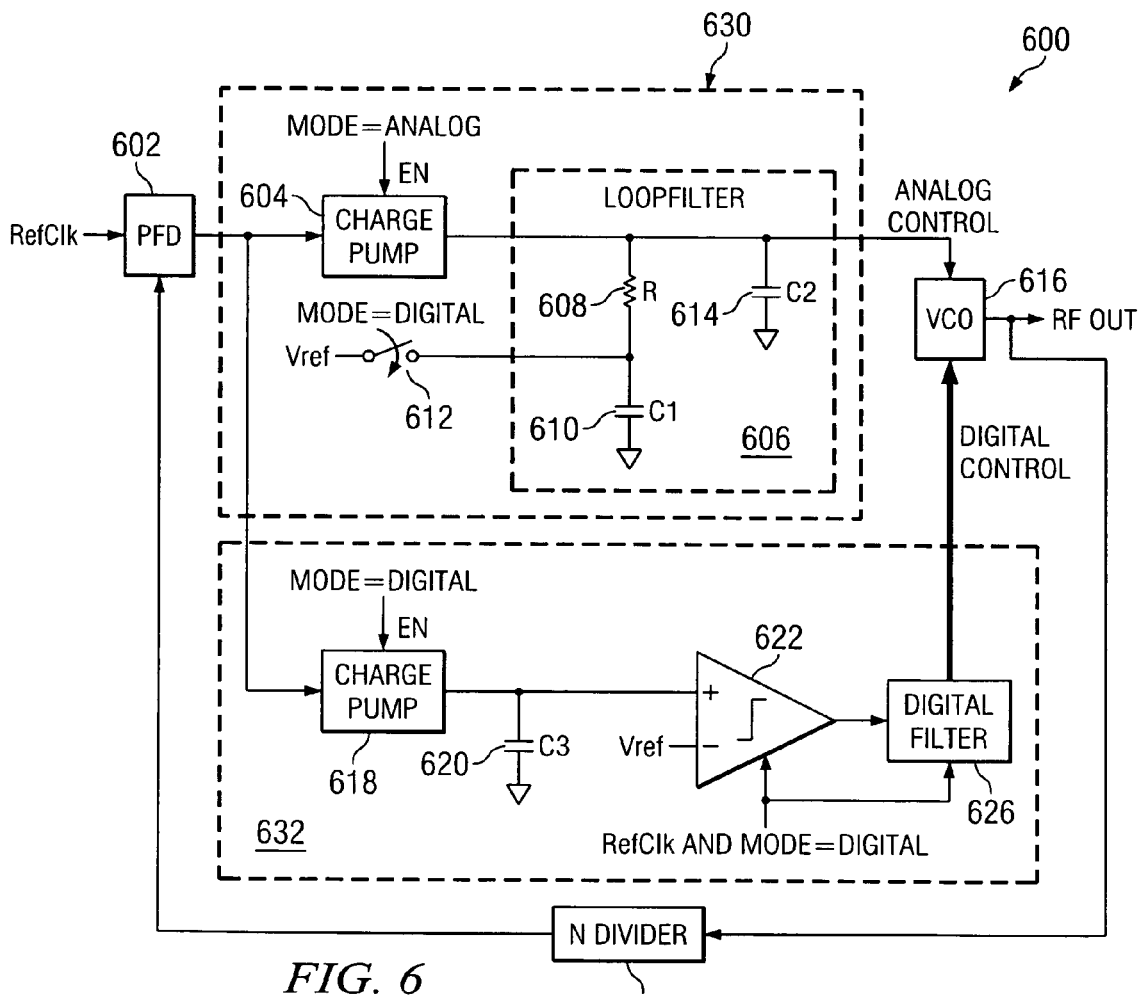
FIG. 6

PHASE-LOCKED LOOP WITH A DIGITAL CALIBRATION LOOP AND AN ANALOG CALIBRATION LOOP

CROSS-REFERENCE TO RELATED APPLICATIONS

This application claims priority to the provisional application, U.S. Pat. App. No. 60/665,679, entitled "Phase-Locked Loop with Automatically Calibrated VCO", filed on Mar. 28, 2005, by James E. C. Brown et al. The above-referenced provisional application is incorporated herein by reference.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present disclosure is directed to phase-locked loops, and more particularly, but not by way of limitation, to phase-locked loops suitable for wireless local area networks (LANs).

BACKGROUND OF THE INVENTION

Phase-locked loop (PLL) circuits are able to synthesize radio frequency (RF) signals that are "locked" to a frequency reference such as a crystal oscillator or other reference. In designing a PLL, it is desirable to minimize the sensitivity of the synthesized frequency to noise coupling from other components. One way to reduce the sensitivity of the synthesized frequency is to reduce the voltage controlled oscillator (VCO) gain. Unfortunately, reducing the VCO gain also causes the frequency range of the VCO to be reduced.

SUMMARY OF THE INVENTION

In at least some embodiments, a phase-locked loop (PLL) architecture is provided that includes a voltage-controlled oscillator (VCO). The PLL architecture also includes a digital calibration loop coupled to the VCO. The digital calibration loop implements a digital filter to provide a digital control to the VCO for centering a VCO frequency output. The PLL architecture also includes an analog calibration loop coupled to the VCO. The analog calibration loop provides an analog control to the VCO for adjusting the centered VCO frequency output.

In at least some embodiments, a method for implementing a phase-locked loop (PLL) is provided. The method includes providing a first VCO calibration based on a digital filter output and providing a second VCO calibration based on an analog loopfilter output. The second VCO calibration adjusts a VCO frequency within a step size of the first VCO calibration.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

FIG. 5A illustrates a simplified VCO with analog and digital control signals in accordance with embodiments of the disclosure;

FIG. 5B illustrates a capacitance tuning graph of the simplified VCO of FIG. 5A in accordance with embodiments of the disclosure;

FIG. 6 illustrates another phase-locked loop architecture in accordance with alternative embodiments of the disclosure;

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION OF THE PREFERRED EMBODIMENTS

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents.

Embodiments of the disclosure provide a phase-locked loop (PLL) architecture that is able to synthesize a wide range of frequencies with low sensitivity to noise. In at least some embodiments, the PLL architecture utilizes a voltage-controlled oscillator (VCO) having a low gain ($K_v$). This allows scaling of the PLL loopfilter components for on-chip integration without changing the PLL linear dynamics or phase noise performance. Lowering the VCO gain also reduces the supply and substrate noise sensitivity of an LC VCO by a factor equal to or related to the lowered gain. In at least some embodiments, the PLL architecture synthesizes an output frequency using a course calibration provided by a digital calibration loop having a digital filter. A finer calibration is then provided by an analog calibration loop.

Figure 1:
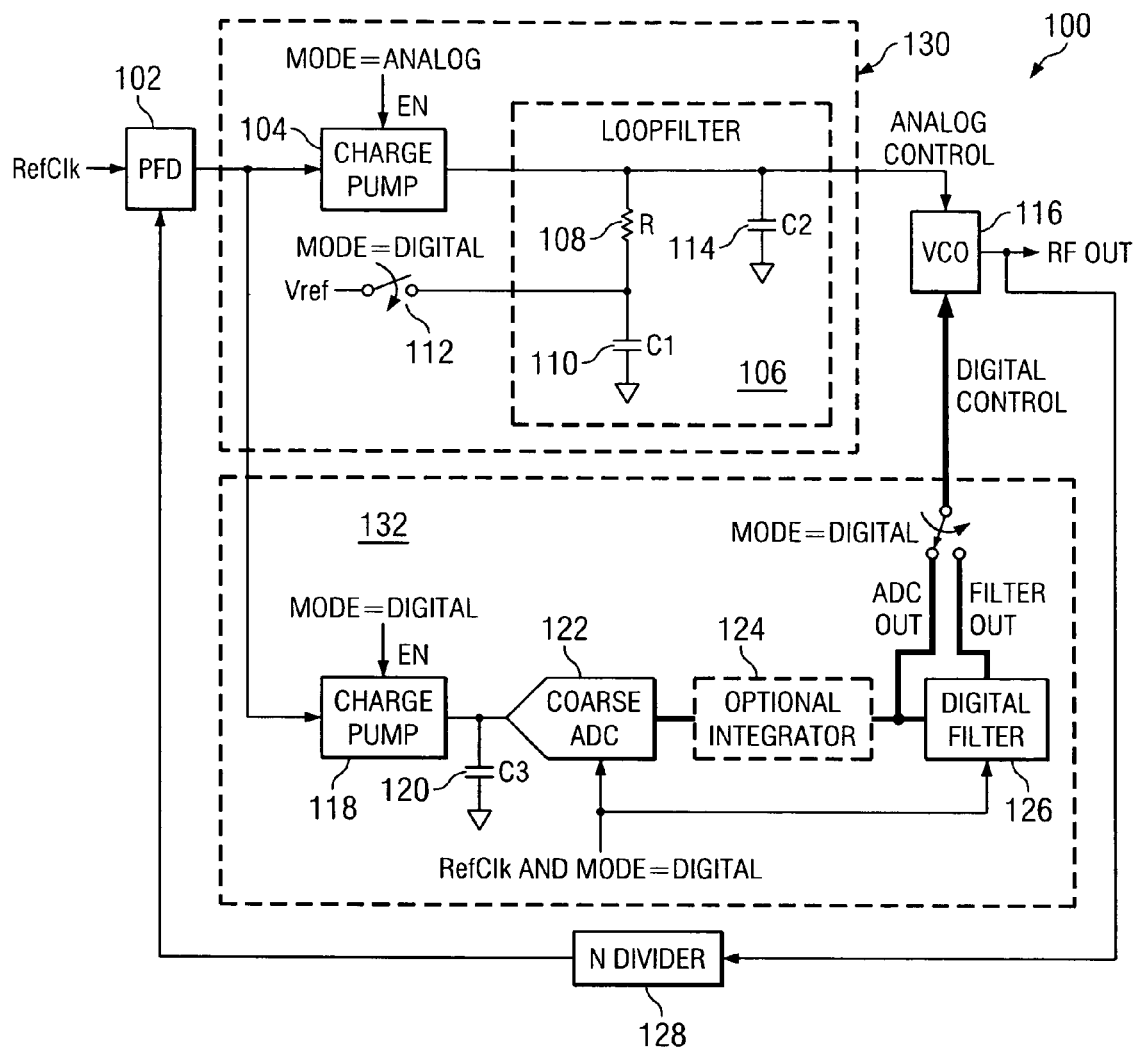
FIG. 1 illustrates a phase-locked loop architecture in accordance with embodiments of the disclosure.

FIG. 1 illustrates a PLL architecture 100 in accordance with embodiments of the disclosure. As shown in FIG. 1, the PLL architecture 100 comprises a phase frequency detector (PFD) 102 that receives as inputs a reference clock signal (RefClk) and a feedback signal from the output of a voltage-controlled oscillator (VCO) 116. Before the VCO output is received by the PFD 102, the VCO output is divided by a value "N" using a divider block 128. To control the VCO output frequency, two calibration loops (or paths) 130 and 132 are employed. The digital calibration loop 132 provides a course digital calibration that centers the VCO frequency at one of several possible frequencies as will later be described and the analog calibration loop 130 provides a fine analog calibration that adjusts or tunes the VCO frequency after the center frequency has been selected. For convenience in describing embodiments of the disclosure, the operation of the PLL architecture 100 will be described using the terms "digital calibration mode" and "analog calibration mode".

As shown, the analog calibration loop 130 comprises a charge pump 104 having an input coupled to the PFD 102 and an output coupled to a loopfilter 106. In at least some embodiments, the loopfilter 106 comprises a resister (R) 108 in series with a capacitor ($C_1$) 110. As shown, the capacitor $C_1$ 110 is connected to a reference voltage ($V_{ref}$). For example, during the digital calibration mode, the charge pump 104 can be disabled and the capacitor $C_1$ 110 can be charged by $V_{ref}$ to center the analog control of the VCO 116. The loopfilter 106 also comprises a capacitor ($C_2$) 114 connected in parallel with the resistor R 108 and capacitor $C_1$ 110. The output of the loopfilter 106 is provided to the VCO 116.

In at least some embodiments, the components of the loopfilter 106 are scaled to control the VCO gain. For example, if the VCO gain is scaled down by a factor "k", the capacitors $C_1$ 110 and $C_2$ 114 are scaled down by k and the resistor R 108 is scaled up by k. Choosing an appropriately low gain for the VCO 116 allows the loopfilter components to be integrated "on-chip" with the other PLL components.

As shown, the digital calibration loop 132 comprises a charge pump 118 having an input coupled to the PFD 102 and an output coupled to a capacitor ($C_3$) 120. In some embodiments, the charge pump 118 and the capacitor $C_3$ 120 can be scaled down to save power and area. For example, if the components of the loopfilter 106 are scaled by k, the capacitor $C_3$ 120 can be scaled down by $k^2$ and the charge pump 118 can be scaled down by k. This particular scaling simplifies the stability analysis by canceling the factor k in the expression for loop gain later described. The output of charge pump 118 also couples to an analog-to-digital converter (ADC) 122 which may be a "course" ADC. During the digital calibration mode, the ADC 122 samples the voltage on capacitor $C_3$ 120 at a frequency determined by the RefClk signal. The output of the ADC 122 is received by a digital filter 126 which averages the ADC samples and compensates the digital calibration loop 132 with phase lead. In some embodiments, a digital integrator 124 can optionally be placed between the ADC 122 and the digital filter 126.

During the digital calibration mode, the output of the digital filter 126 is used as a digital control word for the VCO 116. In some embodiments, the digital filter 126 is a linear filter. In other words, if $$x[n] = \sum_k a_k x_k[n],$$

the output of the linear filter would be $$y[n] = \sum_k a_k y_k[n]$$

where $y_k[n]$ is the system response to $x_k[n]$. Additionally, the digital filter 126 could be a time-invariant system where, for all samples $n_0$, the input sequence with values $x_1[n]=x[n-n_0]$ produces the output sequence with values $y_1[n]=y[n-n_0]$. Alternatively, the digital filter 126 could be a time-varying system that does not fulfill the time-invariance property. After the digital calibration loop 132 settles, the value from the ADC 122 (or the digital integrator 124 if employed) provides a smoothed estimate of the digital filter output and can be used as the digital control word for the VCO 116.

In the analog calibration mode, the ADC 122 and the digital filter 126 are halted and the charge pump 118 is disabled. Also, $V_{ref}$ is disconnected from the capacitor $C_1$ 110 and the charge pump 104 is enabled. With the digital calibration loop 132 disabled and the analog calibration loop 130 enabled, the PLL architecture 100 behaves as a charge-pump PLL with an accurately centered VCO 116. Disabling the digital calibration loop 132 enables the VCO 116 to maintain an accurate center frequency using capacitors having low sensitivity to supply noise. During the analog calibration mode, the only sensitive node is the analog calibration loop 130 which has low sensitivity due to a low VCO gain ($K_v$). By employing the digital calibration loop 132 and the analog calibration loop 130, the PLL architecture 100 is able to implement an integrated (on-chip) loopfilter 106 while being very insensitive to supply or substrate injected noise. The PLL architecture 100 also supports a wide frequency bandwidth based on the digital calibration loop 132 and shortens the settling time of the digital calibration loop 132.

In analyzing the stability of the PLL architecture 100 several factors can be considered. In the digital calibration loop 132, the charge pump 118 drives an integrating capacitor $C_3$ 120 to convert phase difference into a voltage. Also, the ADC output can be integrated by the optional digital integrator 124 to improve its resolution. The VCO 116 also integrates its digital control to produce a phase output. In this manner, the digital calibration loop 132 has up to three integrations to provide a stable VCO output. In contrast, a typical analog charge pump PLL has only two integrations.

In the analog calibration loop 130, stability is achieved by strategically placing a zero formed by the resistor R 108 and the capacitor $C_1$ 110 to produce enough phase lead at the unity crossover frequency. In at least some embodiments, the digital calibration loop 132 involves two zeros, which are realized in the digital filter 126. If an embodiment implements three poles at DC (zero frequency), the zeros should be at a frequency (q) to give about the same margin as two poles at DC and one zero at q. While a resistor could be placed in the digital calibration loop 132 to provide one of these zeros, using digital zeros (via the digital filter 126) reduces the process variation of the zero locations and improves stability. In some cases the nonlinearity caused by clipping the charge pump 118 can create instability.

In the PLL architecture 100 integrating the ADC output is only necessary if the resolution of the ADC 122 is less than the resolution of the digital control for the VCO 116. If the digital integrator 124 is not used, one of the zeros is preferably removed from the stability analysis. An advantage of using the digital integrator 124 is that the charge pump 118 has a reduced voltage compliance requirement because its output is forced on average to the reference analog voltage which produces a zero or mid-scale output of the ADC 122. By design of the ADC 122, this reference analog voltage can be chosen to accommodate the charge pump 118. Also, offsets caused by truncation errors in the digital filter 126 are automatically corrected, eliminating the need for rounding.

An exemplary stability analysis of the digital calibration loop 132 with the digital integrator 124 will now be given. In at least some embodiments, the ADC 122 only has sufficient resolution to keep its quantization noise small enough to prevent over-ranging the VCO control word. To help reduce quantization noise, two smoothing poles are added to the digital filter 126 above the unity gain crossover frequency. The cascade of poles and zeros in the digital filter 126 are arranged so as to minimize the dynamic range requirements at the internal nodes of the digital filter 126. In at least some embodiments, the digital filter 126 is given as:

$$H(z) = \left(\frac{\alpha}{1-z^{-1}}\right)\left(\frac{1-qz^{-1}}{1-q}\right)\left(\frac{1-p_1}{1-p_1z^{-1}}\right)\left(\frac{1-qz^{-1}}{1-q}\right)\left(\frac{1-p_2}{1-p_2z^{-1}}\right)$$

Equation (1)

In equation (1), $\alpha$ is the input scaling of the ADC samples, q is the location of the two zeros, $p_1$ is the first smoothing pole and $p_2$ is the second smoothing pole. While the digital control to the VCO 116 may have large excursions from quantization noise enhanced by the zeros, the output of the digital integrator 124 will be smoothed. Accordingly, after the digital calibration interval, the output of the digital filter 126 may be incorrect due to halting during a wide excursion while the output of the digital integrator 124 will be correct because the excursions are effectively filtered. Therefore, at the end of the digital calibration mode, the output of the digital integrator 124 is used to set the digital control of the VCO 116. If the digital integrator 124 is omitted, the ADC output can be used instead.

The digital calibration loop can be analyzed either in a continuous-time domain or a discrete-time domain. This analysis will use the continuous-time domain and the digital filter 126 will be modeled using the bilinear transform. Using the bilinear transform, the digital filter 126 is given by:

$$[H(z)]_{z=-\frac{1+Ts/2}{1-Ts/2}} = \frac{\alpha(p_1-1)(p_2-1)(sT+2)(sT+2+q(sT-2))^2}{2(q-1)^2 sT(sT+2+p_1(sT-2))}$$
$$(sT+2+p_2(sT-2))$$

Equation (2)

In Equation (2), T is the period of RefClk, q is the location of the two zeros, $p_1$ is the first smoothing pole and $p_2$ is the second smoothing pole. If the VCO gain of the analog input is $$\frac{K_v}{k}$$

and the analog control is assumed to have a range of 1V, then choosing the VCO digital gain (i.e., one digital step) as $$\frac{K_v}{2k}$$

results in a 50% overlap between adjacent digital steps and prevents holes in the overall tuning range. When the VCO digital control word shifts one step, the VCO 116 will shift frequency by $$\pm\frac{K_v}{2k}.$$

The loop-gain of the digital calibration loop 132 is given by:

$$L(s) =$$

Equation (3)

$$\alpha I_{CP2}K_v(p_1-1)\frac{\alpha I_{CP2}K_v(p_1-1)(p_2-1)}{4C_3N(q-1)^2s^3T(sT+2+p_1(sT-2))}$$
$$(sT+2+p_2(sT-2))$$

In Equation (3), $I_{CP2}$ is the charge pump current and N is the feedback divider value. The zero at $-2/T$ is inconsequential and a result of the bilinear transform. The two real zeros for stability are at $$s_z = \frac{2(q-1)}{(q+1)T}.$$

Since the digital calibration loop 132 is used only for centering the VCO 116, the noise performance of the digital calibration loop 132 is not important. Accordingly, the bandwidth of the digital calibration loop 132 can be large for fast settling. If the bandwidth of the digital calibration loop 132 is selected to be six times the bandwidth of the analog calibration loop 130, the zeros differ by a factor of 6/3=2 (i.e., the bandwidth has a 3× sensitivity to zero locality). To solve for the zero locations, the zeros for the digital calibration loop 132 are equated to two times the zero for the analog calibration loop 130 as shown in Equation (5). Equation (6) shows a solution for q based on Equation (5).

$$\frac{2(q-1)}{(q+1)T} = -\frac{2}{RC_1}$$

Equation (5)

$$q = \frac{RC_1 - T}{RC_1 + T}$$

Equation (6)

After designing the analog calibration loop 130 for the desired phase margin and using Equation (6) to find the value for q, the poles $p_1$ and $p_2$ are selected as a compromise between stability and reduction of quantization noise. Also, the gain $\alpha$ is selected to maximize the phase margin. If $C_3=C_1/1\ k^2$ and $I_{CP2}=I_{CP1}/k$, a stable digital calibration loop 132 results.

Figure 2:
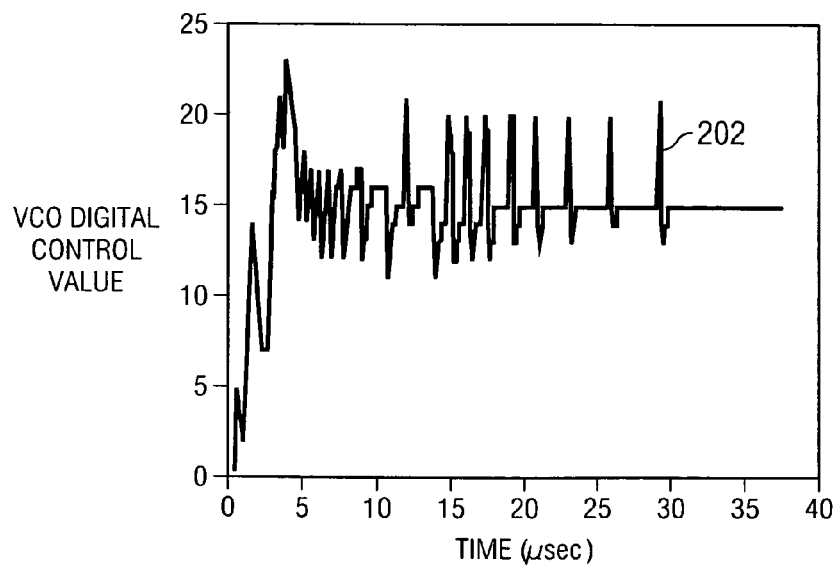
FIG. 2 illustrates a settling response simulation of a digital control value for a voltage controlled oscillator (VCO) in accordance with an embodiment of the disclosure.

FIG. 2 illustrates a settling response simulation 200 of a digital control value for a VCO in accordance with an embodiment of the disclosure. The digital control value 202 is simulated as the output of a digital filter which may be provided to a VCO. The settling response simulation 200 is based on a behavioral C++ program written to simulate the behavior of the PLL architecture 100 in the time domain. The program uses an undersampled VCO technique as described in M. H. Perrott's "Behavioral Simulation of Fractional-N Frequency Synthesizers and other PLL Circuits", IEEE Design and Test of Computers, vol. 19, pp. 74-83, July 2002.

For the settling response simulation 200, the parameters of the PLL architecture 100 are defined as k=20, R=6640 $\Omega$, $C_1$=750 pF, $C_2$=50 pF, $C_3$=37.5 pF, $I_{CP2}$=20 µA, $K_v$/k=25 MHz/V. The parameters of the digital filter (e.g., the digital filter 126) are defined as $\alpha$=0.125, q=0.99, $p_1$=0.9 and $p_2$=0.7. The simulated ADC has 5-bit resolution. Also, T=25 ns and the analog calibration loop bandwidth=90 kHz. The digital calibration loop bandwidth is about 300 kHz with a phase margin of about 36 degrees. This settling response is approximately a 25% improvement over a typical charge pump PLL simulation with the parameters R=332 $\Omega$, $C_1$=15 nF, $C_2$=1 nF, $I_{CP1}$=400 µA, T=25 ns, N=120, $K_v$=500 MHz/V and an analog loop bandwidth of 90 kHz. The reason for the improvement is the higher bandwidth of the digital calibration loop 132. Further improvement in the settling time is obtainable by increasing the digital calibration loop bandwidth. Simulations have shown settling times as low as 10 µs using a 5-bit ADC.

As shown in FIG. 2, the digital control value 202 quickly rises to a value above 20 then varies between the values 12 and 20 until the simulation is halted at about 30 µs. Due to the instability of the digital control value 202, the final calibrated value used with the VCO 116 is based on the output of the digital integrator 124 or the ADC 122 rather that the output of the digital filter.

Figure 3:
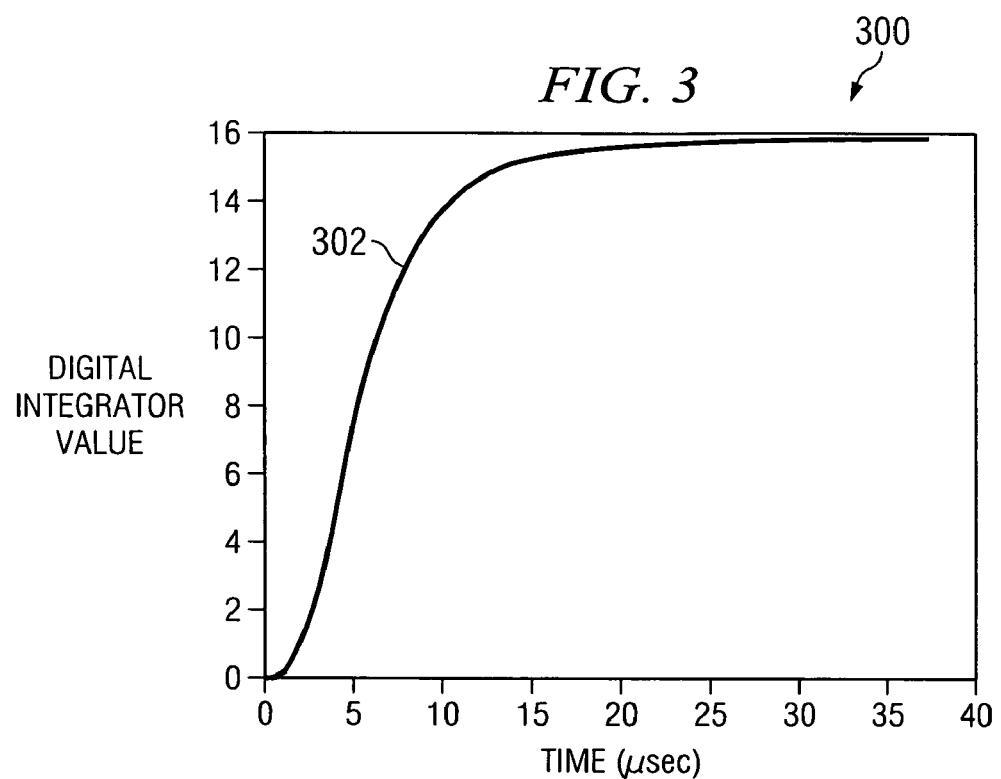
FIG. 3 illustrates a settling response simulation of a digital integrator value in accordance with embodiments of the disclosure.

FIG. 3 illustrates a settling response simulation 300 of a digital integrator value in accordance with embodiments of the disclosure. As shown in FIG. 3, the digital integrator value 302 ranges from values 0-16. The digital integrator value 302 is used as the VCO control word after the digital calibration mode is complete.

Figure 4:
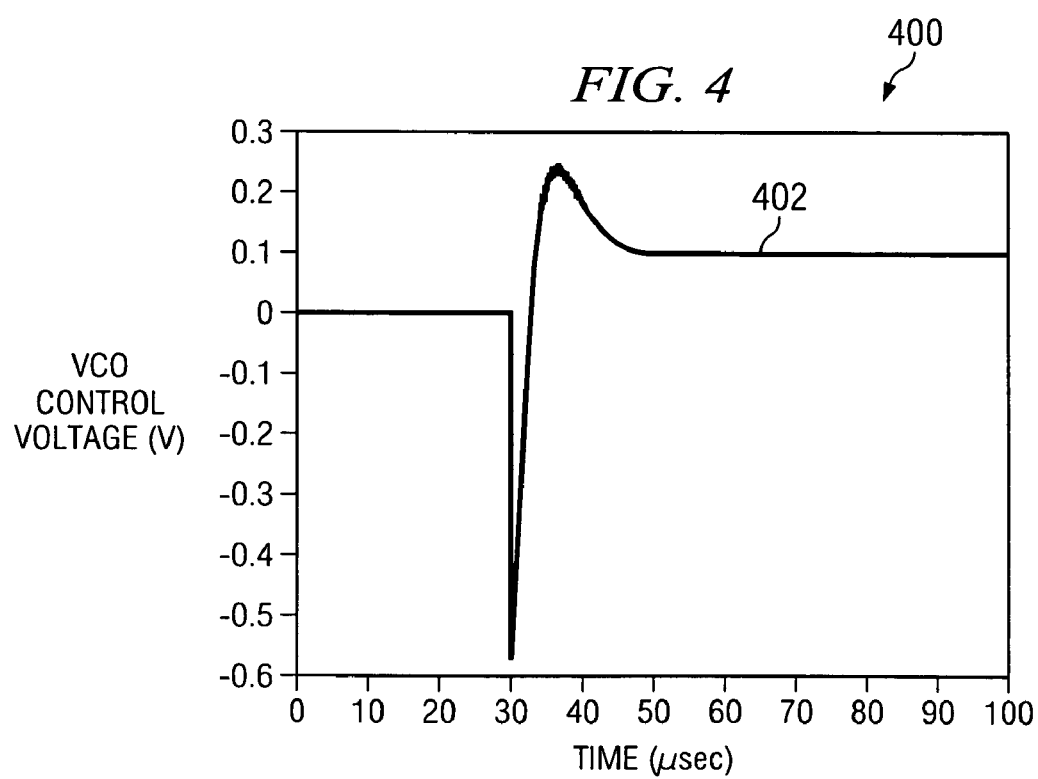
FIG. 4 illustrates a settling response simulation of a VCO analog control voltage in accordance with embodiments of the disclosure.

FIG. 4 illustrates a settling response simulation 400 of a VCO analog control voltage in accordance with embodiments of the disclosure. As shown in FIG. 4, the VCO analog control voltage 402 is enabled after about 30 µs and settles to a value of approximately 0.1 within 20 µs of being enabled.

FIG. 5A illustrates a simplified VCO 500 with analog and digital control signals in accordance with embodiments of the disclosure. As shown in FIG. 5A, the VCO 500 comprises two capacitive elements: a capacitor bank 502 and a variable capacitor (varactor) 504. The VCO 500 also comprises inductors 506 and operates as an oscillating LC circuit. The digital control signal is received by the capacitor bank 502 which determines an operating range for the VCO oscillations. In at least some embodiments, the VCO 500 receives the digital control signal from a digital filter (e.g., the digital filter 126) during a digital calibration mode. After the digital calibration mode is complete, the digital control signal is provided by a digital integrator (e.g., the digital integrator 124) or an ADC (e.g., the ADC 122) of a digital calibration loop (e.g., the digital calibration loop 132). The analog control signal is received by a variable capacitor (varactor) 504 which fine tunes the operating frequency of the VCO 500 during the analog calibration mode (after the digital calibration mode is complete).

FIG. 5B illustrates a capacitance tuning graph 540 of the simplified VCO of FIG. 5A in accordance with embodiments of the disclosure. As shown in FIG. 5B, the capacitance tuning graph 540 compares capacitance as a function of capacitor tuning voltage. At points 522 and 524, capacitor bank operating points are shown as if the digital calibration for the VCO 500 had already occurred. During digital calibration, the digital control signal is received by the capacitor bank 502 and functions to center the capacitance for the VCO 500. The capacitor bank operating points 522 and 524 show the approximate step size used for the digital calibration. Within the step size provided by the course digital calibration, the analog tuning range 526 is able to adjust the capacitance of the VCO 500 up or down to fine tune the operating frequency of the VCO 500. Preferably, the capacitors in the capacitor bank 502 and the varactor 504 are insensitive to small variations in the tuning or supply voltage.

FIG. 6 illustrates another PLL architecture 600 in accordance with alternative embodiments of the disclosure. Similar to the PLL architecture 100 described in FIG. 1, the PLL architecture 600 uses two calibration loops (or paths) 630 and 632 to calibrate the VCO operating frequency. The digital calibration loop 632 provides a course digital calibration that centers the VCO frequency and the analog calibration loop 630 provides a fine analog calibration that adjusts or tunes the VCO frequency after the center frequency has been selected. In contrast to the PLL architecture 100, the PLL architecture 600 of FIG. 6 employs a digital calibration loop 632 with a comparator 622.

As shown in FIG. 6, the PLL architecture 600 comprises a phase frequency detector (PFD) 602 that receives as inputs a reference clock signal (RefClk) and a feedback signal from the output of a voltage-controlled oscillator (VCO) 616. Before the VCO output is received by the PFD 602, the VCO output is divided by a value "N" using a divider block 628. For convenience in describing embodiments of the disclosure, the operation of the PLL architecture 600 will be described using the terms "digital calibration mode" and "analog calibration mode".

As shown, the calibration loop 630 comprises a charge pump 604 having an input coupled to the PFD 602 and an output coupled to a loopfilter 606. In at least some embodiments, the loopfilter 606 comprises a resister (R) 608 in series with a capacitor ($C_1$) 610. As shown, the capacitor $C_1$ 610 is connected to a reference voltage ($V_{ref}$). For example, during the digital calibration mode, the charge pump 604 can be disabled and the capacitor $C_1$ 610 can be charged by $V_{ref}$ to center the analog control of the VCO 616. The loopfilter 606 also comprises a capacitor ($C_2$) 614 connected in parallel with the resistor R 608 and capacitor $C_1$ 610. The output of the loopfilter 606 is provided to the VCO 616.

In at least some embodiments, the components of the loopfilter 606 are scaled to control the VCO gain. For example, if the VCO gain is scaled down by a factor "k", the capacitors $C_1$ 610 and $C_2$ 614 are scaled down by k and the resistor R 608 is scaled up by k. Choosing an appropriately low gain for the VCO 616 allows the loopfilter components to be integrated "on-chip" with the other PLL components.

As shown, the digital calibration loop 632 comprises a charge pump 618 having an input coupled to the PFD 602 and an output coupled to a capacitor ($C_3$) 620. In some embodiments, the charge pump 618 and the capacitor $C_3$ 620 can be scaled down to save power and area. For example, if the components of the loopfilter 606 are scaled by k, the capacitor $C_3$ 620 can be scaled down by $k^2$ and the charge pump 618 scaled down by k. This particular scaling simplifies the stability analysis by canceling the factor k in the expression for loop gain later described. The output of charge pump 618 also couples to a comparator 622. During the digital calibration mode, the comparator 622 samples the voltage on capacitor $C_3$ 620 at a frequency determined by the RefClk signal. The output of the comparator 622 is received by a digital filter 626 which averages the comparator samples and compensates the digital calibration loop 632 with phase lead. The digital filter output is used as a control word for the VCO 616. In some embodiments, the digital filter 626 is a linear filter. In other words, if $$x[n] = \sum_k a_k x_k[n],$$

the output of the linear filter would be $$y[n] = \sum_k a_k y_k[n]$$

where $y_k[n]$ is the system response to $x_k[n]$. Additionally, the digital filter 626 could be a time-invariant system where, for all samples $n_0$, the input sequence with values $x_1[n]=x[n-n_0]$ produces the output sequence with values $y_1[n]=y[n-n_0]$. Alternatively, the digital filter 626 could be a time-varying system that does not fulfill the time-invariance property. After the digital calibration loop 632 settles, the PLL architecture 600 enters the analog calibration mode.

In the analog calibration mode, the comparator 622 and the digital filter 126 are halted and the charge pump 618 is disabled. Also, $V_{ref}$ is disconnected from the capacitor $C_1$ 110 and the charge pump 604 is enabled. With the digital calibration loop 632 disabled and the analog calibration loop 630 enabled, the PLL architecture 600 behaves as a charge-pump PLL with an accurately centered VCO 616. Disabling the digital calibration loop 632 enables the VCO 616 to maintain an accurate center frequency using capacitors having low sensitivity to supply noise. During the analog calibration mode, the only sensitive node is the analog calibration loop 630 which has low sensitivity due to a low VCO gain ($K_v$). By employing the digital calibration loop 632 and the analog calibration loop 630, the PLL architecture 600 is able to implement an integrated (on-chip) loopfilter 606 while being very insensitive to supply or substrate injected noise. The PLL architecture 600 also supports a wide frequency range using the digital calibration loop 632 and reduces phase noise of the VCO 616.

In analyzing the stability of the PLL architecture 600 several factors can be considered. In the digital calibration loop 632, the charge pump 618 drives an integrating capacitor $C_3$ 620 to convert phase difference into a voltage. Also, the comparator output can be integrated in the digital filter 626. The VCO 616 also integrates its digital control to produce a phase output. In this manner, the digital calibration loop 632 provides up to three integrations to provide a stable VCO output. In contrast, a typical analog charge pump PLL has only two integrations.

In the analog calibration loop 630, stability is achieved by strategically placing a zero formed by the resistor R 608 and the capacitor $C_1$ 610 to produce enough phase lead at the unity crossover frequency. In at least some embodiments, the digital calibration loop 632 involves two zeros, which are realized in the digital filter 626. While a resistor could be placed in the digital calibration loop 632 to provide one of these zeros, using digital zeros (via the digital filter 626) reduces the process variation of the zero locations and improves stability. In some cases, nonlinearity caused by clipping the charge pump 618 can create instability.

An exemplary stability analysis of the digital calibration loop 632 will now be given. This analysis will use the continuous time-domain and the digital filter 626 will be modeled using the bilinear transform. Though the two zeros required for stability can be complex, for simplicity, real and equal zeros are selected. If all three poles are at DC, the zeros should both be at q to give about the same phase margin as two poles at DC and one zero at q. In at least some embodiments, the digital filter 626 is arranged as:

$$\left[\frac{(q-z)^2}{(q-1)^2(z-1)z^2}\right]_{z=\frac{1+Ts/2}{1-Ts/2}} = \frac{(sT-2)(sT+2+q(sT-2))^2}{2(q-1)^2 sT(sT+2)^2} \quad \text{Equation (7)}$$

In equation (7), T is the reference clock period and q is the location of the two discrete real zeros. If the VCO gain of the analog input is $K_v$ and the analog control is assumed to have a range of 1V, then choosing the VCO digital gain (i.e., one digital step) as $$\frac{K_v}{2}$$

results in a 50% overlap between adjacent digital steps and prevents holes in the overall tuning range. When the VCO digital control word shifts one step, the VCO 116 will shift frequency by $$\pm \frac{K_v}{2}.$$

The loop-gain of the digital calibration loop 132 is given by:

$$L(s) = \frac{I_{CP2} K_v (sT-2)(sT+2+q(st-2))^2}{4 C_3 N (q-1)^2 s^3 T (sT+2)^2} \quad \text{Equation (8)}$$

In Equation (8), $I_{CP2}$ is the charge pump current and N is the feedback divider value. The zero at 2/T is inconsequential and a result of the bilinear transform. The two real zeros for stability are at $$s_z = \frac{2(q-1)}{(q+1)T}.$$

Since the digital calibration loop 632 is used only for centering the VCO 616, the noise performance of the digital calibration loop 632 is not important. Accordingly, the bandwidth of the digital calibration loop 632 can be large for fast settling. If the bandwidth of the digital calibration loop 632 is selected to be ten times the bandwidth of the analog calibration loop 630, the zeros differ by a factor of 10/3 (i.e., the bandwidth has a 3× sensitivity to zero locality). To solve for the zero locations, the digital calibration loop 632 zeros are equated to 10/3 times the zero for the analog calibration loop 630 as shown in Equation (9). Equation (10) shows a solution for q based on Equation (9).

$$\frac{2(q-1)}{(q+1)T} = -\frac{10}{3RC_1} \qquad \text{Equation (9)}$$

$$q = \frac{3RC_1 - 5T}{3RC_1 + 5T} \qquad \text{Equation (10)}$$

The PLL architecture 600 can be designed by selecting the desired phase margin for the analog calibration loop 630 and using Equation (10) to find the value for q. If $C_3=C_1/k^2$ and $I_{CP2}=I_{CP1}/k$, a stable digital calibration loop 632 with approximately 10 times faster settling results than using an analog calibration loop results.

Figure 7:
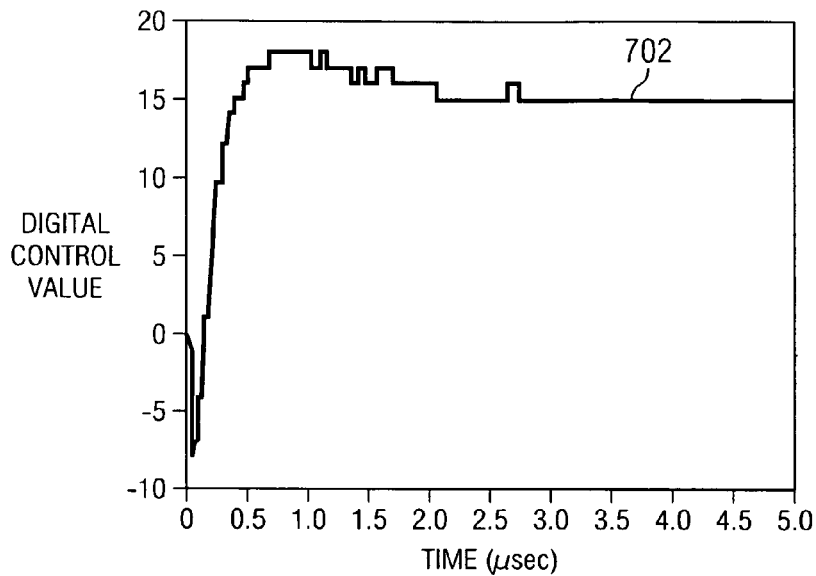
FIG. 7 illustrates a settling response simulation of a digital control value in accordance with alternative embodiments of the disclosure.

FIG. 7 illustrates a settling response simulation 700 of a digital control value in accordance with alternative embodiments of the disclosure. The digital control value 702 is simulated as the output of a digital filter which may be provided to a VCO. The settling response simulation 700 is based on a behavioral C++ program written to simulate the behavior of the PLL architecture 600 in the time domain. The program uses an undersampled VCO technique as described in M. H. Perrott's "Behavioral Simulation of Fractional-N Frequency Synthesizers and other PLL Circuits", IEEE Design and Test of Computers, vol. 19, pp. 74-83, July 2002.

For the settling response simulation 700, the parameters of the PLL architecture 100 are defined as k=20, R=6640 Ω, $C_1$=750 pF, $C_2$=50 pF, $C_3$=1.875 pF, $I_{CP2}$=10 µA, q=1−1/64, T=25 and $K_v$=25 MHz/V. This gives an analog loop bandwidth of about 90 kHz and a digital loop bandwidth of about 900 kHz. This settling response is approximately a 200% improvement over a typical charge pump PLL simulation with the parameters R=332 Ω, $C_1$=15 nF, $C_2$=1 nF, $I_{CP1}$=400 µA, T=25 ns, N=120 and $K_v$=500 MHz/V, and an analog loop bandwidth of 90 kHz. One reason for the improvement is the linear settling behavior of the digital calibration loop 632, which avoids the slewing behavior of a purely analog PLL. As shown in FIG. 7, the digital control value 702 quickly rises to a value of about 18 then settles to a value of approximately 15 in about 2.5 µs.

Figure 8:
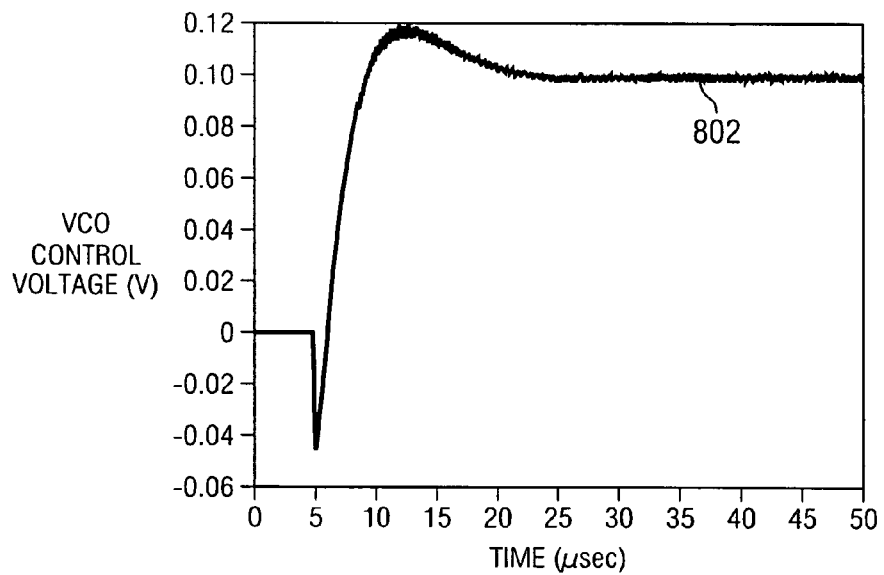
FIG. 8 illustrates a settling response simulation of a VCO analog control voltage in accordance with alternative embodiments of the disclosure.

FIG. 8 illustrates a settling response simulation 800 of a VCO analog control voltage in accordance with alternative embodiments of the disclosure. As shown in FIG. 8, the VCO analog control voltage 802 is enabled after about 5 µs and settles to a value of approximately 0.1 within 25 µs of being enabled.

Figure 9:
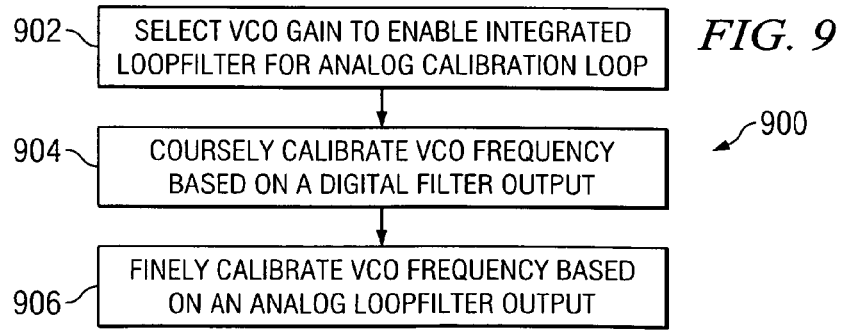
FIG. 9 illustrates a method in accordance with embodiments of the disclosure.

FIG. 9 illustrates a method 900 in accordance with embodiments of the disclosure. As shown in FIG. 9, the method 900 comprises selecting a VCO gain to enable an integrated loop-filter for an analog calibration loop (block 902). At block 904, the VCO frequency is coarsely calibrated based on a digital filter output. In at least some embodiments, the digital filter output is provided to a capacitor bank of the VCO. Finally, the VCO frequency is finely tuned based on an analog loopfilter output (block 906). For example, the VCO frequency may be finely tuned by providing an analog loopfilter output to a varactor of the VCO.

While several embodiments have been provided in the present disclosure, it should be understood that the disclosed systems and methods may be embodied in many other specific forms without departing from the spirit or scope of the present disclosure. For example, an analog calibration loop and digital calibration loop according to the PLL architectures 100 and 600 could share a single charge pump (with appropriate control) rather than implement two separate charge pumps. The present examples are to be considered as illustrative and not restrictive, and the intention is not to be limited to the details given herein, but may be modified within the scope of the appended claims along with their full scope of equivalents. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown or discussed as directly coupled or communicating with each other may be coupled through some interface or device, such that the items may no longer be considered directly coupled to each other but may still be indirectly coupled and in communication, whether electrically, mechanically, or otherwise with one another. Other examples of changes, substitutions, and alterations are ascertainable by one skilled in the art and could be made without departing from the spirit and scope disclosed herein.

What is claimed is:

1. A phase-locked loop (PLL) architecture, comprising:
   a voltage-controlled oscillator (VCO);
   a digital calibration loop coupled to the VCO, the digital calibration loop implements a digital filter to provide a digital control to the VCO for centering a VCO frequency output; and
   an analog calibration loop coupled to the VCO, the analog calibration loop provides an analog control to the VCO for adjusting the centered VCO frequency output, wherein, during a digital calibration mode, a charge pump (CP1) of the analog calibration loop is disabled and a reference voltage is supplied to a capacitor of the analog calibration loop.

2. The PLL architecture of claim 1 wherein the digital filter comprises a linear filter.

3. The PLL architecture of claim 2 wherein the digital filter comprises a time-invariant filter.

4. The PLL architecture of claim 2 wherein the digital filter comprises a time-varying filter.

5. The PLL architecture of claim 1 wherein the VCO comprises a capacitor bank that receives a digital control signal from the digital calibration loop and a varactor that receives an analog control signal from the analog calibration loop.

6. The PLL architecture of claim 1 wherein a frequency bandwidth of the digital calibration loop is greater than the frequency bandwidth of the analog calibration loop.

7. A phase-locked loop (PLL) architecture, comprising:
   a voltage-controlled oscillator (VCO);
   a digital calibration loop coupled to the VCO, the digital calibration loop implements a digital filter to provide a digital control to the VCO for centering a VCO frequency output; and
   an analog calibration loop coupled to the VCO, the analog calibration loop provides an analog control to the VCO for adjusting the centered VCO frequency output, wherein, during an analog calibration mode, a charge pump (CP1) is enabled and a reference voltage to a capacitor is disabled.

8. A phase-locked loop (PLL) architecture, comprising:

a voltage-controlled oscillator (VCO);

a digital calibration loop coupled to the VCO, the digital calibration loop implements a digital filter to provide a digital control to the VCO for centering a VCO frequency output;

an analog calibration loop coupled to the VCO, the analog calibration loop provides an analog control to the VCO for adjusting the centered VCO frequency output;

a charge pump (CP2);

a capacitor coupled to the charge pump (CP2); and an analog-to-digital converter (ADC) coupled to the charge pump (CP2) and the digital filter, wherein an output of the digital filter is selectively coupled to the VCO.

9. The PLL architecture of claim 8 wherein, during an analog calibration mode, the digital filter is disabled and the ADC provides a digital control to the VCO.

10. The PLL architecture of claim 8 wherein the digital calibration loop further comprises a digital integrator coupled between the ADC and the digital filter.

11. The PLL architecture of claim 10 wherein, during an analog calibration mode, the digital filter is disabled and the digital integrator provides a digital control to the VCO.

12. A phase-locked loop (PLL) architecture, comprising:

a voltage-controlled oscillator (VCO);

a digital calibration loop coupled to the VCO, the digital calibration loop implements a digital filter to provide a digital control to the VCO for centering a VCO frequency output;

an analog calibration loop coupled to the VCO, the analog calibration loop provides an analog control to the VCO for adjusting the centered VCO frequency output;

a charge pump (CP2);

a capacitor coupled to the charge pump (CP2); and a comparator coupled to the charge pump (CP2) and the digital filter, wherein an output of the digital filter is selectively coupled to the VCO.

13. The PLL architecture of claim 12 wherein the output of the digital filter is connected to the VCO during a digital calibration mode and is disconnected from the VCO during an analog calibration mode.

* * * * *